(12) United States Patent
Inoue

(10) Patent No.: US 10,127,996 B2
(45) Date of Patent: Nov. 13, 2018

(54) TEST CIRCUIT FOR MEMORY DEVICE AND SEMICONDUCTOR INTEGRATED DEVICE INCLUDING THE TEST CIRCUIT

(71) Applicant: MegaChips Corporation, Osaka (JP)

(72) Inventor: Hidefumi Inoue, Chiba (JP)

(73) Assignee: MegaChips Corporation, Osaka (JP)

( * ) Notice: Subject to any disclaimer, the term of this patent is extended or adjusted under 35 U.S.C. 154(b) by 0 days.

(21) Appl. No.: 15/451,758

(22) Filed: Mar. 7, 2017

(65) Prior Publication Data

US 2017/0256327 A1 Sep. 7, 2017

(30) Foreign Application Priority Data

Mar. 7, 2016 (JP) .................................. 2016-043692

(51) Int. Cl.

| G11C 29/00 | (2006.01) |
|---|---|
| G11C 29/48 | (2006.01) |
| G11C 16/10 | (2006.01) |
| G11C 16/26 | (2006.01) |
| G11C 29/56 | (2006.01) |
| G11C 29/16 | (2006.01) |

(52) U.S. Cl.
CPC .............. G11C 29/48 (2013.01); G11C 16/10 (2013.01); G11C 16/26 (2013.01); G11C 29/16 (2013.01); G11C 29/56004 (2013.01); G11C 29/56008 (2013.01); *G11C 2029/5602* (2013.01)

(58) Field of Classification Search
CPC ... G11C 29/48; G11C 29/56004; G11C 16/26; G11C 16/10; G11C 29/56008; G11C 2029/5602; G11C 29/36; G11C 2029/0401; G11C 2029/3602; G11C 29/38; G11C 29/42; G11C 29/44; G11C 16/04; G06F 11/1068

See application file for complete search history.

(56) References Cited

U.S. PATENT DOCUMENTS

| 6,711,042 B2 | 3/2004 | Ishikawa | |
|---|---|---|---|
| 2005/0240842 A1* | 10/2005 | Yonaga | G01R 31/31723 714/724 |
| 2007/0171739 A1* | 7/2007 | Kim | G06F 11/1068 365/201 |

(Continued)

FOREIGN PATENT DOCUMENTS

| JP | 2003-77296 A | 3/2003 |
|---|---|---|
| JP | 2008-108326 A | 5/2008 |

*Primary Examiner* — Guerrier Merant
(74) *Attorney, Agent, or Firm* — Osha Liang LLP

(57) ABSTRACT

An efficient test for a flash memory combined with a logic chip and incorporated in a semiconductor integrated device can be executed.

A logic chip combined with a rewritable nonvolatile memory and incorporated in a semiconductor integrated device is provided with a test circuit. The test circuit reads a programmable test sequence transmitted from an external tester and stored, generates a memory control signal specific to the nonvolatile memory in accordance with a product ID read on the basis of the test sequence, executes a test in which the generated memory control signal is outputted to the nonvolatile memory, and outputs, to the tester, a test result based on a value outputted from the nonvolatile memory in response to the memory control signal.

20 Claims, 7 Drawing Sheets

(56) References Cited

U.S. PATENT DOCUMENTS

| | | | |
|---|---|---|---|
| 2008/0104458 A1* | 5/2008 | Uchida | G11C 29/36 |
| | | | 714/719 |
| 2008/0282119 A1 | 11/2008 | Suzuki et al. | |
| 2011/0251819 A1* | 10/2011 | Ong | G01R 31/31928 |
| | | | 702/120 |
| 2014/0253099 A1* | 9/2014 | Han | G01R 19/00 |
| | | | 324/126 |
| 2015/0135026 A1* | 5/2015 | Lai | G11C 29/08 |
| | | | 714/718 |

* cited by examiner

| COMMAND NAME | Byte1 | Byte2 | Byte3 | Byte4 | Byte5 |
|---|---|---|---|---|---|
| IDRead | x10 | Manufacturer ID expected value A1 | Device ID expected value A2 | Device ID expected value A3 | |
| KGDCheck | x20 | Address setting value B1 | Address setting value B2 | Address setting value B3 | KGD GOOD ID expected value B4 |
| ChipErase | xA0 | | | | |
| ChipWrite | xB0 | Write pattern C1 | Chip Size setting value C2 | Page Size setting value C3 | |
| ChipRead | xC0 | Read pattern D1 | Chip Size setting value D2 | Page Size setting value D3 | |
| Polling | xD0 | Cycle setting value E1 | Cycle setting value E2 | Cycle setting value E3 | |
| End | xFF | | | | |

| No. | COMMAND NAME | Byte1 | Byte2 | Byte3 | Byte4 | Byte5 |
|---|---|---|---|---|---|---|
| 1 | IDRead | x10 | A1 | A2 | A3 | |
| 2 | KGDCheck | x20 | B1 | B2 | B3 | B4 |
| 3 | ChipErase | xA0 | | | | |
| 4 | Polling | xD0 | E1 | E2 | E3 | |
| 5 | ChipRead | xC0 | D1 | D2 | D3 | |
| 6 | ChipWrite | xB0 | C1 | C2 | C3 | |
| 7 | ChipRead | xC0 | D1 | D2 | D3 | |
| 8 | End | xFF | | | | |

TEST CIRCUIT FOR MEMORY DEVICE AND SEMICONDUCTOR INTEGRATED DEVICE INCLUDING THE TEST CIRCUIT

BACKGROUND OF THE INVENTION

Field of the Invention

The present invention relates generally to test circuits for a memory device and a semiconductor integrated device including the test circuit, and particularly to a test circuit for a flash memory and a semiconductor integrated device that incorporates the flash memory and the test circuit combined therein, such as an ASIC.

Description of the Related Art

As the capacity and speed of an LSI chip increase, a cost required to test the LSI chip increases more and more. A test facilitating technology called BIST (built-in self test), in which part of a tester function of testing an LSI chip is incorporated as a test circuit in the LSI chip, is employed as an attempt to lower the test cost.

For example, Patent Document 1 (Japanese Patent Application Publication No. 2003-077296) discloses a multichip-package (MCP) semiconductor device in which a logic chip and a memory chip are incorporated in a common package. The semiconductor device includes a selector/output circuit that selects either a memory access signal or an access signal for a memory test and executes a logic-chip-to-memory-chip access operation test when the access signal for a memory test is selected.

Patent Document 2 (Japanese Patent Application Publication No. 2008-108326) relates to a storage device that incorporates a nonvolatile memory, such as a NOR flash memory, and a self-test method, and discloses a technology for executing a self-test in a test circuit incorporated in the storage device itself. More specifically, Patent Document 2 discloses a storage device including a single chip that incorporates a nonvolatile memory that stores test step items and parameters, and a control circuit that causes the nonvolatile memory to undergo the test steps using the step items and the parameters.

SUMMARY OF THE INVENTION

An ASIC vender combines a flash memory acquired as a KGD (known good die) from a memory vender with a variety of logic circuits, incorporates such combined parts in a single package, and provides the packaged product as an ASIC. Since the ASIC as a whole needs to be guaranteed in terms of quality, the ASIC vender needs to test the flash memory itself and the variety of logic circuits.

Read/write operation performed on a flash memory, however, typically requires a period several tens of times longer than in a case of the other memory devices, such as a DRAM. Therefore, executing different tests in a sequential manner, as described in Patent Document 1, undesirably requires a long period until all the tests are completed, resulting in an increase in the test cost.

The ASIC vender typically employs flash memories manufactured by a plurality of flash memory venders from a viewpoint of ASIC manufacture/supply risk management. Further, the ASIC vender employs flash memories of different models manufactured by the same memory vender from the same point of view.

These flash memories have independent specifications on a memory vendor basis and a model basis, and whether or not a test circuit is built in a flash memory, a method for controlling the flash memory, and a command used to operate the flash memory also vary on a memory vender basis and a model basis. Therefore, to test a flash memory, it is necessary to prepare a test sequence based on a variety of parameters and commands on a memory vender basis and a model basis, resulting in an increase in the test cost. For example, in the storage apparatus disclosed in Patent Document 2 described above, test step items and parameters are stored in the nonvolatile memory and cannot therefore be used with a product from another memory vender or with another model even from the same memory vender.

In view of the circumstances descried above, an object of the present invention is to provide a test circuit capable of efficiently testing a nonvolatile memory combined with other parts and incorporated in a semiconductor integrated device, such as an ASIC.

More specifically, an object of the present invention is to provide a test circuit capable of efficiently testing a semiconductor integrated device including a flash memory under minimum control of a tester.

Another object of the present invention is to provide a test circuit capable of handling flash memories having different specifications on a memory vender basis and a model basis and a semiconductor integrated device including the test circuit.

The present invention for achieving the objects described above has the matter specifying the invention or technical features:

That is, the present invention according to an aspect may be a test circuit in a logic chip mounted together with a rewritable nonvolatile memory on a semiconductor integrated device. The test circuit may he configured to read a test sequence transmitted from an external tester and stored, generate a memory control signal specific to the nonvolatile memory based on the test sequence, execute a test in which the generated memory control signal is outputted to the nonvolatile memory. Further, the test circuit may be configured to output, to the tester, a test result based on a value outputted from the nonvolatile memory in response to the memory control signal.

The test sequence may contain a plurality of execution commands. Some of the plurality of execution commands may each contain, as a parameter (argument), an expected value outputted when the nonvolatile memory operates normally in response to the memory control signal corresponding to the execution command.

The test circuit may compare a value outputted from the nonvolatile memory in response to the memory control signal with the expected value and output the test result.

The test circuit may further include a command buffer that stores the test sequence. The test circuit, when it receives a first control command from the tester, may store a test sequence subsequently transmitted from the tester in the command buffer.

The test circuit may read the test sequence stored in the command buffer and generate the memory control signal when the test circuit receives a second control command from the tester.

The test circuit may further include an external interface circuit having a plurality of pins connected to the tester. The test circuit may operate so as to release a pin used in the test to another test when the external interface circuit detects a pin release signal at any of the plurality of pins.

The test circuit may be connected to the nonvolatile memory in accordance with an SPI (Standard Peripheral Interface) standard.

The nonvolatile memory may he a flash memory.

The test circuit may read a product ID of the nonvolatile memory from the nonvolatile memory based on a predetermined execution command in the test sequence.

The test circuit may select an argument used in accordance with the product ID of the nonvolatile memory from a plurality of arguments contained in an arbitrary execution command in the test sequence and generate the memory control signal.

The present invention according to another aspect may be a semiconductor integrated device configured by a rewritable nonvolatile memory and a test circuit that executes a test for the nonvolatile memory. The nonvolatile memory and the test circuit may be provided in a package. The test circuit may he configured to read a test sequence transmitted from an external tester and stored, generate a memory control signal specific to the nonvolatile memory based on the test sequence, execute a test in which the generated memory control signal is outputted to the nonvolatile memory. Further, the test circuit may output, to the tester, a test result based on a value outputted from the nonvolatile memory in response to the memory control signal.

The present invention according to a still another aspect may be a method for executing a test for a semiconductor integrated device configured by a rewritable nonvolatile memory and a test circuit that executes a test for the nonvolatile memory. The nonvolatile memory and the test circuit may be provided in a package. The test execution method may include connecting the semiconductor integrated device to an external tester in such a way that the semiconductor integrated device can communicate with the external tester, and receiving and storing a test sequence transmitted from the tester. Further, the method may include reading the stored test sequence and generating a memory control signal specific to the nonvolatile memory based on the read test sequence, outputting the generated memory control signal to the nonvolatile memory to test the nonvolatile memory, receiving a value outputted from the nonvolatile memory in response to the memory control signal, comparing the value outputted from the nonvolatile memory with an expected value outputted when the nonvolatile memory operates normally in response to the memory control signal corresponding to the outputted value, and outputting a result of the comparison as a test result to the tester.

According to the present invention, a test for a nonvolatile memory mounted together with a logic chip on a semiconductor integrated device can be efficiently executed.

Further, according to the present invention, a test for a semiconductor integrated device including a flash memory that varies in terms of specifications on a vender basis and a model basis can be efficiently executed under minimum control of a tester.

Other technical features, objects, and effects or advantages of the present invention will be apparent from the following embodiment described with reference to the accompanying drawings.

BRIEF DESCRIPTION OF THE DRAWINGS

FIG. 3 shows an example of an execution command definition table used in a self-test circuit according to an embodiment of the present invention;

FIG. 4 shows an example of an execution command sequence in a self-test circuit according to an embodiment of the present invention;

DETAILED DESCRIPTION OF THE EMBODIMENTS

Figure 1:
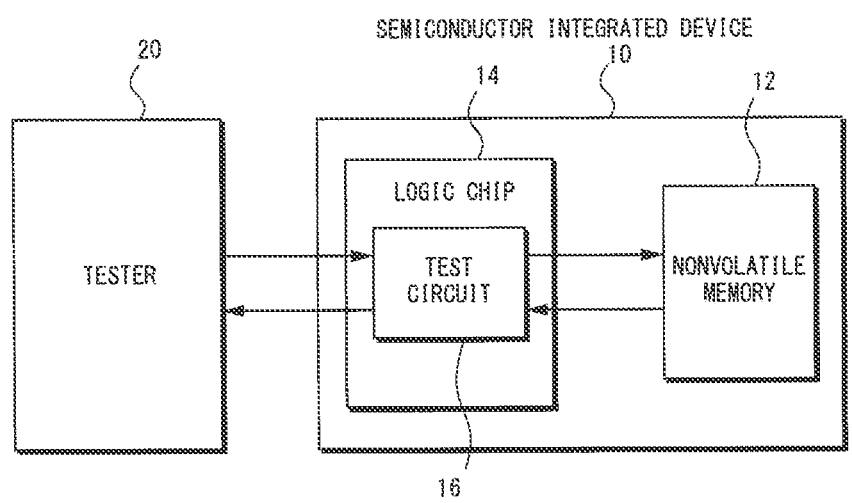
FIG. 1 is a block diagram for illustrating a semiconductor integrated device provided with a self-test circuit according to an embodiment of the present invention.

An embodiment of the present invention will be described below with reference to the drawings. It is, however, noted that the embodiment described below is presented only by way of example, and it is not intended to exclude a variety of changes and technology applications that are not explicitly described below. The present invention can be implemented in a variety of variations (e.g., combination of embodiments) to the extent that they do not depart from the substance of the present invention. Further, in the illustration in the following drawings, the same or similar portion has the same or similar reference character. The drawings are schematically drawn, and the dimensions, ratios, and other factors in the drawings do not necessarily coincide with actual dimensions, ratios, and other factors. Also in some figures, some portions may be drawn in a dimension ratio and other ratios different from the actual dimension ratio and other ratios.

The present embodiment discloses a semiconductor integrated device that may incorporate a rewritable nonvolatile memory and logic chips configured by a variety of logic circuits. The semiconductor integrated device may include a test circuit for controlling execution of a test for the nonvolatile memory. The test circuit may be configured to autonomously operate in accordance with a programmable test sequence provided from a tester.

FIG. 1 is a block diagram for schematically illustrating a configuration of a semiconductor integrated device according to an embodiment of the present invention. A semiconductor integrated device 10, which is under test, may be placed, when tested, for example, on a placement table (not shown) connected to a tester 20 in such a way that the semiconductor integrated device 10 can communicate with the tester 20. In FIG. 1, one semiconductor integrated device 10 is connected to the tester 20, but not necessarily, and a plurality of semiconductor integrated device 10 may he allowed to be connected to the tester 20.

The semiconductor integrated device 10 may include, for example, a rewritable nonvolatile memory (hereinafter simply referred to as "nonvolatile memory") 12 and a logic chip 14, and may he configured as so-called a system-in-package. The semiconductor integrated device 10 may be considered as a kind of ASIC (Application Specific Integrated Circuit).

The nonvolatile memory 12 may typically be a flash memory. In this example, the nonvolatile memory 12 may be assumed to be a flash memory compliant with the SPI (Serial Peripheral Interface) standard, As the nonvolatile memory 12, a KGD (known good die), which is guaranteed to be a non-defective product in a non-packaged bare-chip state, may be typically employed, but not necessarily. The nonvolatile memory 12 may, for example, be formed of a single module or a plurality of modules.

The logic chip 14 may he a chip formed of a logic circuit for achieving a variety of functions. The logic chip 14 may, for example, carry out a predetermined process in accordance with a signal provided from an external apparatus. The logic chip 14, when it carries out the predetermined process, may access the nonvolatile memory 12 and read and write data as required. The logic chip 14 in the present embodiment may include a test circuit 16, which may control operation of the nonvolatile memory 12 to test the nonvolatile memory 12.

The tester 20 may be an example of an external apparatus, which may test the semiconductor integrated device 10. To test the nonvolatile memory 12, the tester 20 may transmit a test sequence necessary for the test for the nonvolatile memory 12 of the semiconductor integrated device 10 to the test circuit 16 of the semiconductor integrated device 10 and receive test result data outputted from the test circuit 16 in response to the transmission of the test sequence. The test sequence may contain, for example, commands and/or parameters (e.g., expected value), as will be described later. The expected value may be an output result expected when the nonvolatile memory 12, which operates in accordance with the test sequence, operates normally and may, for example, be a value specified in advance by a test operator. The tester 20 may further perform analysis based on the test result data and then output a result of the analysis. The test circuit 16 in the present embodiment may allow the tester 20 to carry out another process, for example, execute a test for a portion other than the test circuit 16 of the logic chip 14 of the semiconductor integrated device 10 after the tester 20 transmits the test sequence for testing the nonvolatile memory 12 of the semiconductor integrated device 10 but before the tester 20 receives the test result data.

Figure 2:
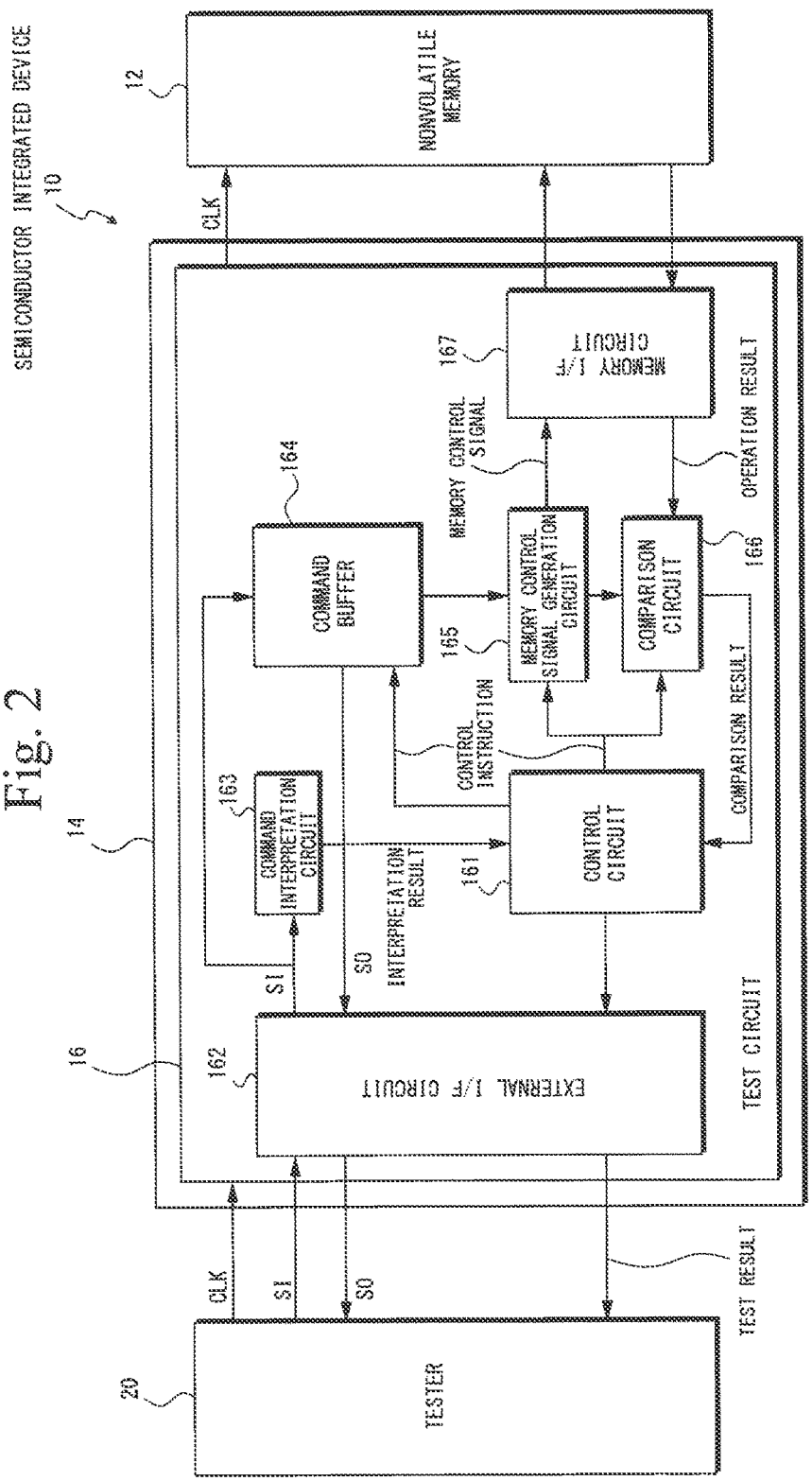
FIG. 2 is a block diagram for illustrating a self-test circuit according to an embodiment of the present invention.

FIG. 2 is a block diagram for illustrating the configuration of the test circuit according to the embodiment of the present invention. The test circuit 16 may receive the test sequence from the tester 20 and test the nonvolatile memory 12 independently of other tests and in accordance with a clock signal CLK and transmit a result of the test to the tester 20.

The test circuit 16 may include, for example, a control circuit 161, an external interface circuit 162, a command interpretation circuit 163, a command buffer 164, a memory control signal generation circuit 165, a comparison circuit 166, and a memory interface circuit 167, as shown in FIG. 2.

The control circuit 161 may be a circuit that oversees and controls the action of the test circuit 16. The control circuit 161 may perform a variety of types of control on the basis of an interpretation result sent from the command interpretation circuit 163, as will be described later.

The external interface circuit 162 may be a circuit configured to function as an interface with the tester 20 or any other external apparatus. The external interface circuit 162 may have a plurality of pins (terminals) that are not shown but are connected the tester 20 such that the external interface circuit 162 can communicate with the tester 20. For example, to cause the test circuit 16 to operate in a predetermined test mode, the tester 20 may output a predetermined signal to a predetermined pin, and thus the external interface circuit 162 may detects the predetermined signal. The predetermined test mode may, for example, include a through test mode in which a test signal from the tester 20 is directly transmitted to the nonvolatile memory 12 and a result of the test according to the test signal is received, and a self-test mode in which the nonvolatile memory 12 is tested on the basis of a memory control signal (i.e., test signal in present example) generated under the control of the test circuit 16. Further, the external interface circuit 162, when it detects a pin release signal from the tester 20, may so operate as to release a pin in use. By way of this, the pin used for the predetermined test may be released, and the tester 20 may be allowed to execute another test.

The command interpretation circuit 163 may be a circuit that interprets an input signal SI received from the tester 20 via the external interface circuit 162. The command interpretation circuit 163 may output a result of the interpretation to the control circuit 161.

The command buffer 164 may store, as the test sequence, the input signal SI transmitted from the tester 20 via the external interface circuit 162 and then output the test sequence under the control of the control circuit 161. Specifically, when the control circuit 161 provides the command buffer 164 with a write control instruction, the command buffer 164 may sequentially store the test sequence supplied via the external interface circuit 162 in a specified storage area. Further, when the control circuit 161 provides the command buffer 164 with a read instruction, the command buffer 164 may sequentially read the test sequence from the specified storage area and output the read test sequence to the memory control signal generation circuit 165. The command buffer 164 may further transmit the read test sequence as an output signal SO to the tester 20 via the external interface circuit 162 in response to a control instruction from the control circuit 161.

The memory control signal generation circuit 165 may generate a memory control signal for executing a test for the nonvolatile memory 12 under control of the control circuit 161. That is, the memory control signal generation circuit 165 may generate a memory control signal for controlling the action of the nonvolatile memory 12 in accordance with an execution command contained in the test sequence supplied from the command buffer 164, and output the memory control signal to the memory interface circuit 167, while outputting a parameter (expected value) according to the execution command to the comparison circuit 166.

The comparison circuit 166 may be a circuit that compares, under control of the control circuit 161, the expected value supplied from the memory control signal generation circuit 165 with an output value (operation result) received from the memory interface circuit 167. The comparison circuit 166 may output a result of the comparison to the control circuit 161, and thus the control circuit 161 may receive the result and output a test result to the tester 20 via the external interface circuit 162.

The memory interface circuit 167 may be a circuit configured to function as an interface with the nonvolatile memory 12. In this example, the memory interface circuit 167 may be configured to be capable of accessing a flash memory in accordance with the SPI standard.

FIG. 3 shows examples of the execution command provided to the test circuit according to the embodiment of the present invention. Each execution command may be convened in the test circuit 16 into a memory control signal specific to the nonvolatile memory 12 and supplied to the nonvolatile memory 12.

Specifically, each execution command, which may be represented, for example, by a 1-byte code, may have an argument, as shown in FIG. 3. In this example, each execution command may be a 5-byte fixed-length code. An execution command "IDRead" may he a command for reading a product ID from the nonvolatile memory 12 and comparing the product ID with an expected value specified by an argument. The vender that provides the nonvolatile memory 12 and the model of the nonvolatile memory 12 may be identified on the basis of the read product ID. An execution command "KGDCheck" may be a command for reading a value representing that the nonvolatile memory 12 supplied from the vender is a KGD by using the address indicated by a setting value specified by an argument and comparing the read value with an expected value specified by an argument. An execution command "ChipErase" may be a command for erasing data written to the nonvolatile memory 12 collectively. An execution command "ChipWrite" may be a command for writing a predetermined pattern to the nonvolatile memory 12. An execution command "ChipRead" may be a command for reading a pattern written to the nonvolatile memory 12 and comparing the read pattern with an expected value specified by an argument. An execution command "Polling" may be a command for determining that a timeout occurs when a process in the nonvolatile memory 12 is not completed in a period specified by an argument and bringing a test for the nonvolatile memory 12 into abnormal termination. An execution command "END" may be a command for bringing a test for the nonvolatile memory 12 into normal termination. As for an execution command having a plurality of arguments, such as the execution command "KGDCheck," an argument to be used may be selected from the plurality of arguments contained in the execution command on the basis of the product ID read by the execution command "IDRead."

FIG. 4 shows an example of the test sequence of a test used by the test circuit according to the embodiment of the present invention. A test sequence 400 may be formed of a group of execution commands, such as those described above, and may, for example, be transmitted from the tester 20 via the external interface circuit 162 and stored in the command buffer 164. That is, when the command interpretation circuit 163 of the test circuit 16 receives, from the tester 20, a test sequence write instruction control command ("WRITE" command), the test sequence may be written to the command buffer 164 under the control of the control circuit 161.

The test sequence in the present example may be formed of a group of the following execution commands and the arguments thereof: "IDRead," "KGDCheck," "ChipErase," "Polling," "ChipRead," "ChipWrite," "ChipRead," and "END," as shown in FIG. 4. When the command interpretation circuit 163 of the test circuit 16 receives a test sequence execution start instruction control command ("START" command) from the tester 20, the execution commands in the exemplary test sequence shown in FIG. 4 may be sequentially read from the command buffer 164 and outputted to the memory control signal generation circuit 165, and memory control signals specific to the nonvolatile memory 12 may be generated and outputted to the nonvolatile memory 12 under the control of the control circuit 161.

Figure 5:
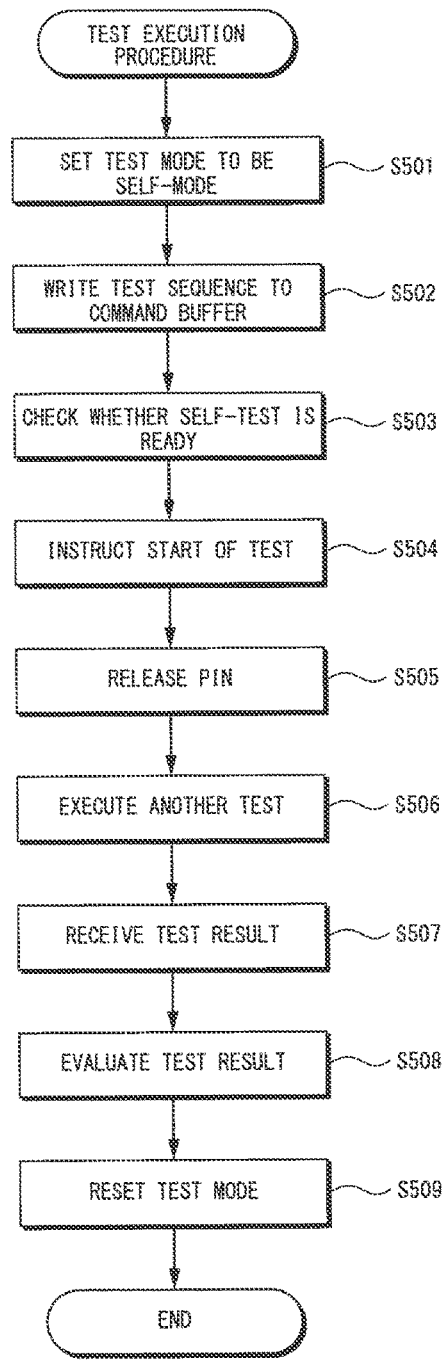
FIG. 5 is a flowchart for illustrating procedure of execution of a test executed by the self-test circuit, out of tests for a semiconductor integrated device according to an embodiment of the invention.

FIG. 5 is a flowchart for schematically illustrating the procedure of execution of the test executed by the self-test circuit, out of the tests for the semiconductor integrated device according to the embodiment of the present invention. Test modes in accordance with which a test for the nonvolatile memory 12 is executed may include, for example, the through test mode and the self-test mode. The through test mode may be a test mode in which the tester 20 transmits a test signal directly to the nonvolatile memory 12 and directly receives a result of the test. On the other hand, the self-test mode may be a test mode in which the test circuit 16 internally generates a test signal, transmits the test signal to the nonvolatile memory 12, and transmits a result of the test to the tester 20. FIG. 5 schematically shows the procedure of execution of a test executed in the self-test mode by the test circuit 16 according to the present embodiment.

More specifically, the tester 20 may set the test mode used in the test circuit 16 of the semiconductor integrated device 10 to be the self-test mode (S501), as shown in FIG. 5. Setting the test mode to be the self-test mode may be achieved by, for example, outputting a predetermined enable signal to a predetermined test mode pin of the external interface circuit 162 of the test circuit 16. The tester 20 may then output the control command "WRITE" via a predetermined control pin, subsequently output the test sequence, and write the test sequence to the command buffer 164 (S502), Upon completion of writing the test sequence to the command buffer 164, the tester 20 may output a control command "READ," read the written test sequence from the command buffer 164, and check whether the write operation has been normally completed, that is, the test circuit 16 is ready for the self-test (S503).

The tester 20 may then output the control command "START" via a predetermined control pin to instruct the test circuit 16 to start executing an autonomous test (S504). The test circuit 16 may then generate memory control signals specific to the nonvolatile memory 12 in accordance with the test sequence and output the memory control signals to the nonvolatile memory 12 to execute a test according to predetermined test items.

After outputting the control command "START," the tester 20 may output a pin release signal to a specific pin to release a pin in use for the test circuit 16 (S505) and use the released pin to execute a test for another circuit, that is, a circuit other than the test circuit 16 (S506). The tester 20 may then observe a predetermined output pin of the external interface circuit 162 of the test circuit 16, and when an output value (operation result) is outputted through the predetermined output pin, the tester 20 may receive the output value (S507). The tester 20 may determine whether or not the nonvolatile memory 12 has passed the predetermined test items (i.e., whether or not action is normal) based on the received output value (S508). The tester 20 may then reset the test mode (cancel self-test mode in present example) when the test according to the test sequence is completed (S509).

Employing the test execution procedure in the self-test mode described above may allow the tester 20 to execute a test for the nonvolatile memory 12 of the semiconductor integrated device 10 and therefore allows the tester 20, after the test starts, to execute another test in parallel or concurrently by using the released pin. For example, the tester 20 can concurrently execute a test for the action of the logic chip 14 excluding the nonvolatile memory 12 and the test circuit 16, whereby the period of the test for the semiconductor integrated device 10 can be shortened, and the test cost can he lowered accordingly.

Figure 6:
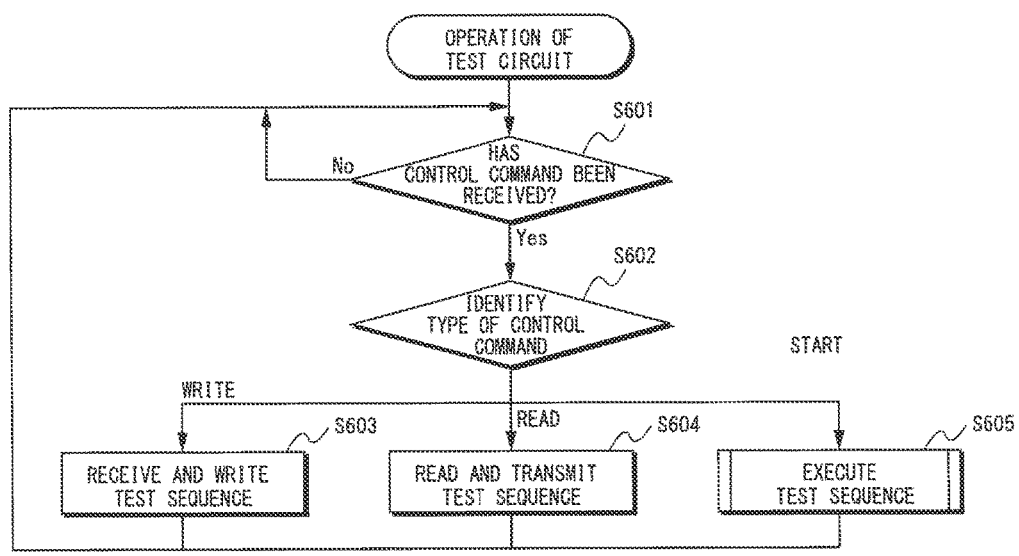
FIG. 6 is a flowchart for illustrating procedure of operation of a self-test circuit of a semiconductor integrated device according to an embodiment of the invention.
Figure 7:
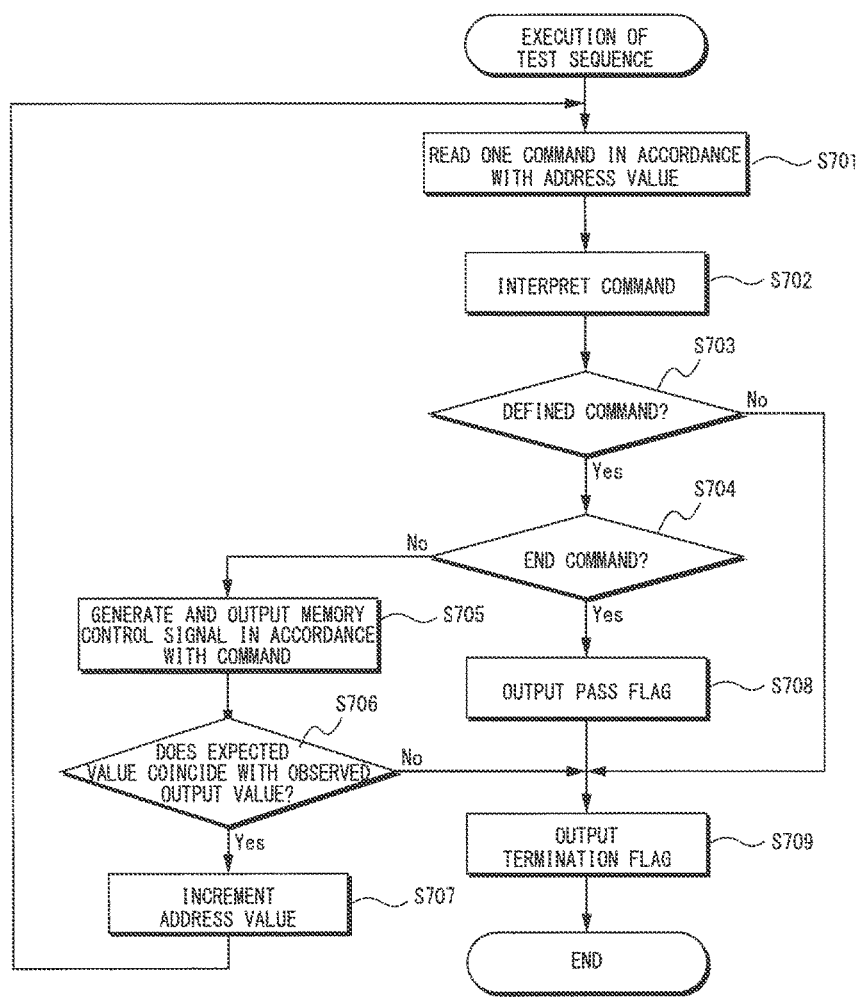
FIG. 7 is a flowchart for illustrating execution of a test sequence in procedures of operation of a self-test circuit of the semiconductor integrated device according to an embodiment of the invention.

FIG. 6 is a flowchart for illustrating the procedure of operation of the self-test circuit of the semiconductor integrated device according to the embodiment of the present invention, and FIG. 7 is a flowchart for illustrating execution of a test sequence. It may be assumed in FIGS. 6 and 7 that the test circuit 16 is so set as to operate in the self-test mode.

More specifically, in the self-test mode, the test circuit 16 may wait until it receives a control command (S601), as shown in FIG. 6. When the test circuit 16 detects reception of a control command (Yes in S601), the command interpretation circuit 163 may interpret the received control command and identify the type thereof (S602). It may be assumed in the present example that the control command may be formed of three commands, the "WRITE" command, which instructs writing to the command buffer 164, the "READ" command, which instructs reading from the command buffer 164, and the "START" command, which instructs execution of the test sequence.

When the command interpretation circuit 163 of the test circuit 16 determines that the received control command is the "WRITE" command (WRITE in S602), the test circuit 16 may store a test sequence (set of execution commands) received after the "WRITE" command at a specified address in the command buffer 164 (S603).

When the command interpretation circuit 163 of the test circuit 16 determines that the received control command is the "READ" command (READ in S602), the test circuit 16 may read a test sequence from the address specified by the "READ" command and transmit the test sequence to the tester 20 (S604).

When the command interpretation circuit 163 of the test circuit 16 determines that the received control command is the "START" command (START in S602), the test circuit 16 may read and execute a test sequence stored in the command buffer 164 (S605). The execution of the test sequence may be described with reference to FIG. 7 below.

Having interpreted and executed the received control command, the command interpretation circuit 163 of the test circuit 16 may wait until it receives the following control command.

Referring to FIG. 7, the test circuit 16 may read one execution command in the test sequence (S701) in accordance with, for example, the address value indicated by an address counter/register that is not shown, and the memory control signal generation circuit 165 may interpret the read execution command (S702). As the address value, in an initial state, the first address of the test sequence storage area in the command buffer 164 may, for example, be specified.

The test circuit 16 may evaluate whether or not a result of the command interpretation refers to a defined execution command (S703). When the test circuit 16 determines that the interpretation result refers to a defined execution command (Yes in S703), the test circuit 16 may subsequently evaluate whether or not the defined execution command is the "END" command (S704). When the test circuit 16 determines that the interpretation result does not refer to a defined execution command (No in S703), the test circuit 16 may set a termination flag, output the termination flag as test result data to the tester 20, and therefore terminate the execution of the test sequence (S709).

When the test circuit 16 determines that the interpretation result does not refer to the "END" command (No in S704), the memory control signal generation circuit 165 of the test circuit 16 may generate a memory control signal for testing the nonvolatile memory 12 in accordance with the interpreted execution command and output the memory control signal to the nonvolatile memory 12 (S705). The comparison circuit 166 of the test circuit 16 may then observe a value outputted from the nonvolatile memory 12 (i.e., output value) in response to the outputted memory control signal. In a case where the product ID of the nonvolatile memory 12 has been already read in response to the "IDRead" command, the memory control signal generation circuit 165 can select an argument used in accordance with the product ID from a plurality of arguments contained in the interpreted execution command and generate a memory control signal on the basis of the instruction from the control circuit 161.

The comparison circuit 166 of the test circuit 16 may, in response to the outputted memory control signal, evaluate whether or not an expected value according to the execution command coincides with the output value from the nonvolatile memory 12 (S706). When a result of the evaluation shows that the expected value coincides with the output value (Yes in S706), the comparison circuit 166 of the test circuit 16 may determine that the nonvolatile memory 12 has passed the test based on the execution command, increment the address value in the address count register by a predetermined value (S707), and return to S701 to process the following execution command in the same manner. In a case where the interpreted execution command is a specific execution command having no expected value as an argument, for example, the "ChipErase" command described above, the test circuit 16 may receive a dummy output value response and proceed to the process in S707.

On the other hand, when a result of the evaluation in S706 shows that the expected value does not coincide with the output value (No in S706), the comparison circuit 166 of the test circuit 16 may determine that the nonvolatile memory 12 has not passed the test based on the execution command, set the termination flag, output the termination flag as test result data to the tester 20, and terminate the execution of the test sequence (S709). To notify the tester 20 whether or not the nonvolatile memory 12 has not passed the test based on any of the commands, the test circuit 16 may set an error flag showing the content of an error and output the error flag to the tester 20.

As described above, the test circuit 16 may sequentially read the execution commands in the test sequence stored in the command buffer 164 one at a time, generate a memory control signal, and output the memory control signal to the nonvolatile memory 12 to execute a test for the nonvolatile memory 12. When the test circuit 16 recognizes the last command in the test sequence, the "END" command, (Yes in S704), the test circuit 16 may determine that the nonvolatile memory 12 has passed all tests according to the test sequence, set a pass flag, output the pass flag to the tester 20 (S708), further set the termination flag, output the termination flag to the tester 20, and terminate the test sequence (S709).

As described above, the test circuit 16 may he provided in the logic chip 14 of the system-in-packaged semiconductor integrated device 10, receive a test sequence from the tester 20, store the test sequence in the command buffer 164, and then receive the test execution instruction control command "START." The test circuit 16 can thus autonomously execute a test for the nonvolatile memory 12 in accordance with the test sequence. The tester 20, after transmitting the test sequence, can therefore concurrently carry out another process, for example, a test for the action of a portion of the semiconductor integrated device 10 excluding the test circuit 16 of the logic chip 14, whereby the cost of test for the semiconductor integrated device 10 can be lowered. Further, the tester 20 can evaluate, when it receives the termination flag, whether or not the semiconductor integrated device 10 has passed the test on the basis of whether or not the pass flag has been set. That is, the tester 20, when it receives the termination flag, may determine that the semiconductor integrated device 10 has passed the test in the case where the pass flag has been set, whereas determining that the semiconductor integrated device 10 has not passed the test in the case where no pass flag has been set.

Further, since the test circuit 16 may be configured to generate a memory control signal specific to the nonvolatile memory 12 on the basis of a command in a test sequence transmitted from the tester 20, the test circuit 16 can identify even a nonvolatile memory 12 provided by a different vender or a nonvolatile memory 12 of a different model from the same memory vender by reading the product ID and generate an appropriate memory control signal, whereby the test circuit 16 can readily test the nonvolatile memory 12.

The embodiment described above is presented by way of example of explanation of the present invention, and it is not intended to limit the present invention only to the embodiment. The present invention can be implemented in a variety of forms to the extent that they do not depart from the substance of the present invention.

For example, in the method disclosed in the present specification, the steps, actions, or functions may be performed concurrently or in different orders to the extent that results thereof cause no contradiction. The steps, actions, and functions described above have been provided only by way of example, and some of the steps, actions, and functions can be omitted or combined with each other into a single step, action, or function, or other steps, actions, or functions may be added to the extent that the omission, combination, and addition do not depart from the substance of the present invention.

Further, in the present specification, in which a certain embodiment has been disclosed, a specific feature (technical item) in the embodiment can be improved as appropriate and the improved feature can be added to another embodiment or can replace a specific feature in the another embodiment. These forms also fall within the substance of the present invention.

The present invention can be widely used in a field of a semiconductor integrated device that incorporates a logic chip and a rewritable nonvolatile memory combined with each other.

What is claimed is:

1. A test circuit in a logic chip mounted together with a rewritable nonvolatile memory on a semiconductor integrated device, comprising:
   circuitry which reads a test sequence transmitted from an external tester and stored, generates a memory control signal by converting the test sequence, and executes a test in which the generated memory control signal is outputted to the nonvolatile memory, wherein the test sequence contains a plurality of execution commands and the memory control signal is specific to the nonvolatile memory based on a product ID responsive to a predetermined execution command of the plurality execution commands; and
   circuitry which outputs, to the tester, a test result based on a value outputted from the nonvolatile memory in response to the memory control signal.

2. The test circuit according to claim 1, wherein some of the plurality of execution commands each contain an expected value, the expected value being a predetermined value to be outputted if the nonvolatile memory operates normally in response to the memory control signal corresponding to the execution command.

3. The test circuit according to claim 2, wherein the test circuit compares a value outputted from the nonvolatile memory in response to the memory control signal with the expected value and outputs the test result.

4. The test circuit according to claim 1, further comprising a command buffer that stores the test sequence,
   wherein the test circuit operates to store the test sequence transmitted from the tester in the command buffer when the test circuit receives a first control command from the tester.

5. The test circuit according to claim 4, wherein the test circuit reads the test sequence stored in the command buffer and generates the memory control signal when the test circuit receives a second control command from the tester.

6. The test circuit according to claim 1, further comprising an external interface circuit having a plurality of pins connected to the tester,
   wherein the external interface operates, when the external interface circuit detects a pin release signal at any of the plurality of pins, so as to release a pin used for the test to another test.

7. The test circuit according to claim 1, wherein the test circuit is connected to the nonvolatile memory in accordance with an SPI (Standard Peripheral Interface) standard.

8. The test circuit according to claim 7, wherein the nonvolatile memory is a flash memory.

9. The test circuit according to claim 1, wherein the test circuit reads the product ID of the nonvolatile memory from the nonvolatile memory based on the predetermined execution command.

10. The test circuit according to claim 9, wherein the test circuit selects an argument used in accordance with the product ID of the nonvolatile memory from a plurality of arguments contained in an execution command in the test sequence and generates the memory control signal based on the selected argument.

11. A semiconductor integrated device comprising:
    a rewritable nonvolatile memory; and
    a test circuit that executes a test for the nonvolatile memory,
    wherein the nonvolatile memory and the test circuit are provided in a package,
    wherein the test circuit
        reads a test sequence transmitted from an external tester and stored, generates a memory control signal by converting the test sequence, and executes a test in which the generated memory control signal is outputted to the nonvolatile memory, wherein the test sequence contains a plurality of execution commands and the memory control signal is specific to the nonvolatile memory identified based on a product ID responsive to a predetermined execution command of the plurality execution commands, and
        outputs, to the tester, a test result based on a value outputted from the nonvolatile memory in response to the memory control signal.

12. A method for executing a test for a semiconductor integrated device configured by a rewritable nonvolatile memory and a test circuit that executes a test for the nonvolatile memory, the nonvolatile memory and the test circuit being provided in a package, the method comprising:
    connecting the semiconductor integrated device to an external tester;
    receiving and storing a test sequence transmitted from the tester, wherein the test sequence contains a plurality of execution commands;
    reading the stored test sequence and generating a memory control signal by converting the read test sequence, wherein the memory control signal is specific to the nonvolatile memory based on a product ID responsive to a predetermined execution command of the plurality execution commands;
    outputting the generated memory control signal to the nonvolatile memory to test the nonvolatile memory;
    receiving a value outputted from the nonvolatile memory in response to the memory control signal;
    comparing the value outputted from the nonvolatile memory with an expected value, wherein the expected value is a predetermined value to be outputted if the nonvolatile memory operates normally in response to the memory control signal corresponding to the execution command; and outputting a result of the comparison as a test result to the tester.

13. The semiconductor integrated device according to claim 11, wherein some of the plurality of execution commands each contain an expected value, the expected value being a predetermined value to be outputted if the nonvolatile memory operates normally in response to the memory control signal corresponding to the execution command.

14. The semiconductor integrated device according to claim 13, wherein the test circuit compares a value outputted from the nonvolatile memory in response to the memory control signal with the expected value and outputs the test result.

15. The semiconductor integrated device according to claim 11, further comprising a command buffer that stores the test sequence, wherein the test circuit operates to store the test sequence transmitted from the tester in the command buffer when the test circuit receives a first control command from the tester.

16. The semiconductor integrated device according to claim 15, wherein the test circuit reads the test sequence stored in the command buffer and generates the memory control signal when the test circuit receives a second control command from the tester.

17. The semiconductor integrated device according to claim 11, further comprising an external interface circuit having a plurality of pins connected to the tester, wherein the external interface operates, when the external interface circuit detects a pin release signal at any of the plurality of pins, so as to release a pin used for the test to another test.

18. The semiconductor integrated device according to claim 11, wherein the test circuit is connected to the nonvolatile memory in accordance with an SPI (Standard Peripheral Interface) standard.

19. The semiconductor integrated device according to claim 11, wherein the test circuit reads the product ID of the nonvolatile memory from the nonvolatile memory based on the predetermined execution command.

20. The semiconductor integrated device according to claim 19, wherein the test circuit selects an argument used in accordance with the product ID of the nonvolatile memory from a plurality of arguments contained in an arbitrary execution command in the test sequence and generates the memory control signal.

* * * * *